(12) United States Patent
Awamura et al.

(10) Patent No.: US 8,605,919 B2
(45) Date of Patent: Dec. 10, 2013

(54) MICROPHONE

(75) Inventors: Ryuji Awamura, Fukuoka (JP); Noriaki Hanada, Fukuoka (JP); Kensuke Nakanishi, Fukuoka (JP); Tetsuo Toyoda, Yao (JP)

(73) Assignee: Hosiden Corporation, Osaka (JP)

( * ) Notice: Subject to any disclaimer, the term of this patent is extended or adjusted under 35 U.S.C. 154(b) by 87 days.

(21) Appl. No.: 12/957,678

(22) Filed: Dec. 1, 2010

(65) Prior Publication Data

US 2011/0135122 A1    Jun. 9, 2011

(30) Foreign Application Priority Data

Dec. 7, 2009 (JP) ................................. 2009-277831

(51) Int. Cl.
*H04R 25/00* (2006.01)

(52) U.S. Cl.
USPC ............................ 381/174; 381/355; 381/369

(58) Field of Classification Search
USPC ......... 381/174, 113, 355, 360–361, 368, 369, 381/173, 175
See application file for complete search history.

(56) References Cited

U.S. PATENT DOCUMENTS

| 7,286,680 B2 * | 10/2007 | Steeman et al. | 381/369 |
| 2007/0058826 A1 * | 3/2007 | Sawamoto et al. | 381/174 |
| 2008/0094753 A1 * | 4/2008 | Brodkin et al. | 360/234.5 |
| 2011/0261987 A1 | 10/2011 | Nakanishi et al. | |

FOREIGN PATENT DOCUMENTS

| JP | 1209896 A | 8/1989 |
| JP | 2007081614 A | 3/2007 |
| JP | 2007329560 A | 12/2007 |
| JP | 200971346 A | 4/2009 |

* cited by examiner

*Primary Examiner* — Suhan Ni
(74) *Attorney, Agent, or Firm* — The Webb Law Firm (57) ABSTRACT

A microphone has a housing (9) defining an acoustic hole (99) and having inner faces. The microphone includes a MEMS capacitor (1) secured to and electrically connected with a first face (6) of the inner faces of the housing (9), the first face defining the acoustic hole (99), a detecting circuit (7) secured to and electrically connected with a second face (8) of the inner faces of the housing (9), the second face (8) being not adjacent the first face (6), the detecting circuit (7) detecting at least a change in the electrostatic capacity of the MEMS capacitor (1). The microphone further includes a flexible substrate (4) secured to the first face (6) and the second face (8) and disposed under a bent state inside the housing (9). The flexible substrate (4) establishes electrical connection between the MEMS capacitor (1) and the detecting circuit (7) via a wire electrically connecting the first face (6) and the second face (8).

2 Claims, 5 Drawing Sheets

MICROPHONE

BACKGROUND OF THE INVENTION

1. Field of the Invention

The present invention relates to a microphone having a MEMS capacitor.

2. Description of the Related Art

In recent years, there have been manufactured small microphones to be mounted in a small electronic instrument such as a mobile phone, an IC reorder, etc. with using the MEMS (micro electro mechanical systems) technique. Japanese Patent Application "Kokai" No. 2007-329560 discloses such a microphone having a capacitor made with the MEMS technique. In this microphone, the MEMS capacitor and a converter circuit comprised of an IC (integrated circuit) are mounted on a common rigid substrate, and over this board, a case having an acoustic hole is placed to complete the microphone. The rigid substrate is formed of a rigid material whose shape does not deform flexibly. The back chamber of the MEMS capacitor is formed within a space created between the MEMS capacitor and the rigid substrate. Further, on the outer face of the rigid substrate (i.e. the opposite face to the face mounting the IC etc.), there is provided a microphone terminal for establishing connection between the electronic instrument or the like and the microphone.

Figure 9:
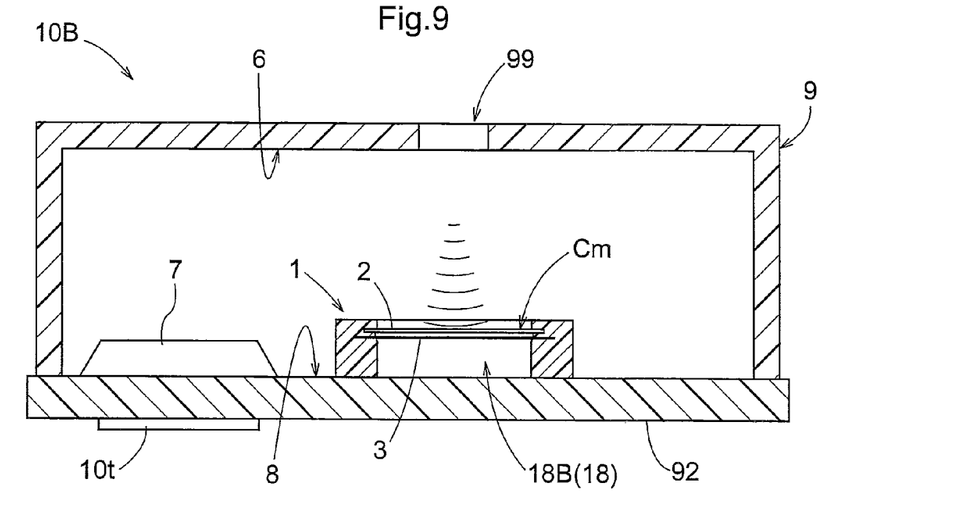
FIG. 9 is a section view schematically showing a conventional top acoustic hole type microphone construction.
Figure 10:
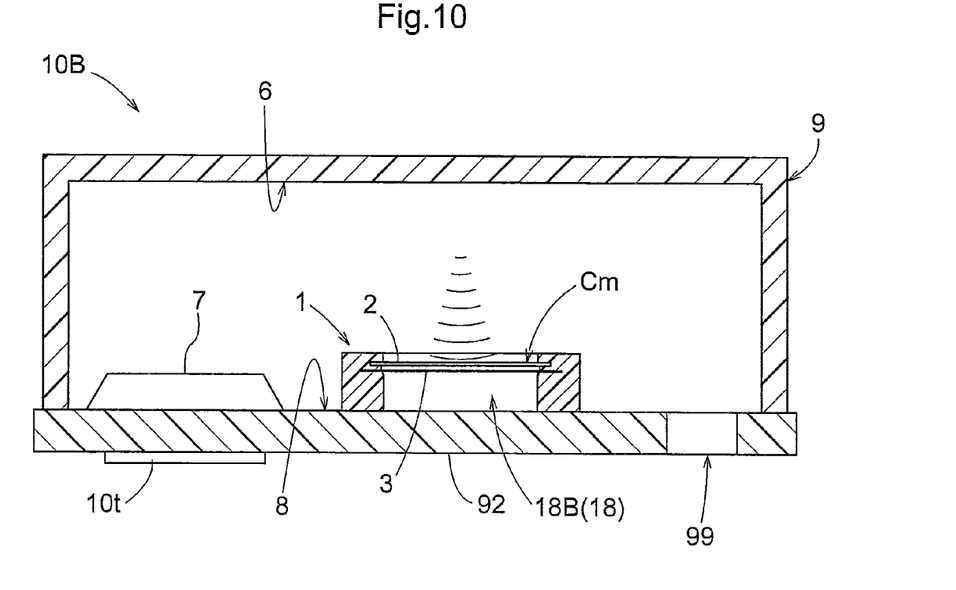
FIG. 10 is a section view schematically showing a conventional bottom acoustic hole type microphone construction.

The microphone disclosed in Japanese Patent Application "Kokai" No. 2007-329560 is a top acoustic hole type microphone with the acoustic hole 99 on the opposite side away from the microphone terminal 10t as shown in FIG. 9 accompanying the present detailed disclosure. However, as shown in FIG. 10 accompanying the present detailed disclosure, there exists also a bottom acoustic hole type microphone having the acoustic hole 99 not on the side of the case, but on the side of the rigid substrate 92 (i.e. on the side of the microphone terminal 10t) in order to restrict intrusion of dust or other foreign substance. In this case too, basically, the back chamber of the MEMS capacitor is formed within the space created between this MEMS capacitor and the rigid substrate.

Japanese Patent Application "Kokai" No. 2007-81614 discloses a microphone wherein in a substrate mounting a MEMS capacitor and an IC chip, an acoustic hole is provided immediately below a trench portion of the MEMS capacitor. In this case, conversely from the arrangements shown in FIGS. 9 and 10, the interior of the housing member excluding the trench portion is configured to function as the back chamber of the MEMS capacitor. However, with the top acoustic hole type microphone of this type, it is not possible to provide the microphone terminal on the rigid substrate mounting the MEMS capacitor and the IC chip. Therefore, the entire housing member is comprised of rigid substrates, through which mechanical connection is provided through a conductive member, whereby there is established electrical connection between the rigid substrate mounting the MEMS capacitor and the converter circuit and the rigid substrate mounting the microphone terminal.

With the above microphones disclosed in Japanese Patent Application "Kokai" No. 2007-329560 and Japanese Patent Application "Kokai" No. 2007-81614, both the MEMS capacitor and the converter circuit are mounted on a same rigid substrate. Therefore, there is necessarily imposed restriction on the layout of the MEMS capacitor within the housing member. With the microphone such as the one disclosed in Japanese Patent Application "Kokai" No. 2007-329560 in particular, since the microphone terminal for the electrical connection with an electronic instrument or the like is provided on the outer face of the rigid substrate, the disposing position of the rigid substrate of the microphone is determined, depending on the disposing position of this microphone terminal. And, the disposing position of the substrate imposes restriction on the layout of the MEMS capacitor inside the housing.

With the microphone disclosed in Japanese Patent Application "Kokai" No. 2007-81614, the housing as a whole is comprised of rigid substrates and the connection is made via a conductive member, thus allowing separation between a rigid substrate mounting the capacitor and the converter circuit and a rigid substrate including the microphone terminal. However, with this connection arrangement comprising two rigid substrates electrically connected to each other, as the connection method is mechanical, the electric resistance is high, so that decay of signals, reduction in the noise resistance can be invited.

Further, the acoustic chamber of the MEMS capacitor affects the acoustic characteristics. Hence, if restriction is imposed on the layout of the MEMS capacitor, in the case of the microphone disclosed in Japanese Patent Application "Kokai" No. 2007-329560 in particular, the size of the back chamber too is restricted. That is, the size of the back chamber depends on the size of the trench formed in the MEMS capacitor, so that the acoustic characteristics of the microphone will largely depend upon the performance of the MEMS capacitor. As a result, it becomes difficult to employ a common MEMS capacitor in various microphones having various housings. As a result, it will become difficult to achieve mass production cost reduction advantage. FIG. 10 in Japanese Patent Application "Kokai" No. 2007-329560 shows an example wherein the back chamber is enlarged by cutting away the substrate (rigid substrate). This arrangement, however, has may disadvantages in the respect of production cost.

Therefore, there is a need for a technique that allows layout of a MEMS capacitor with large degree of freedom without inviting any deterioration in the electrical performance such as signal decay, noise resistance reduction and that allows using of a same MEMS capacitor in various microphones having a variety of housings.

SUMMARY OF THE INVENTION

For accomplishing the above-noted object, according to the characterizing feature of a microphone relating to the present invention, a microphone having a housing defining an acoustic hole and having inner faces, comprises:

a MEMS capacitor secured to and electrically connected with a first face of said inner faces of the housing, said first face defining said acoustic hole;

a detecting circuit secured to and electrically connected with a second face of said inner faces of the housing, said second face being not adjacent said first face, said detecting circuit detecting at least a change in the electrostatic capacity of said MEMS capacitor; and a flexible substrate secured to said first face and said second face and disposed under a bent state inside said housing, said flexible substrate establishing electrical connection between said MEMS capacitor and said detecting circuit via a wire electrically connecting said first face and said second face.

With this characterizing feature, as there is provided a flexible substrate having a wire for electrical connection between the MEMS capacitor and the detecting circuit that are secured to the first face and the second face not adjacent each other inside the housing, the MEMS capacitor and the detecting circuit can be mounted separately on two different faces. Therefore, as the MEMS capacitor and the detecting circuit are connected via the flexible substrate, there is no mechanical connection involved, so it is possible to restrict signal decay in the detection signal of the MEMS capacitor and the reduction in the noise resistance. Further, with the separate mounting of the MEMS capacitor and the detecting circuit on the two different faces, the restriction imposed on the layout of the MEMS capacitor inside the housing is relaxed and there is provided greater degree of freedom in the layout. The size of the back chamber of the MEMS capacitor affects the acoustic characteristics, as described above. In this regard, with the increased degree of freedom in the layout of the MEMS capacitor inside the housing, it becomes easier to obtain desired advantageous acoustic characteristics. Further, as described also above, the size of the back chamber in the MEMS capacitor per se depends upon the size of the trench formed in the MEMS capacitor. In this respect, with the above-described characterizing feature of the invention, the size of the back chamber as a microphone can be determined with taking into consideration not only the size of the trench of the MEMS capacitor per se, but also the space available inside the housing. Therefore, it becomes possible to apply the same MEMS capacitor in various microphones having various housings, so that the cost reduction advantage due to mass production can be obtained more easily.

Preferably, the flexible substrate of the inventive microphone is configured such that the MEMS capacitor is mounted in the area of the flexible substrate secured to said first face. Also, preferably, the flexible substrate of the inventive microphone is configured such that the detecting circuit is mounted in the area of the flexible substrate secured to said second face. The flexible substrate that can be bent inside the housing can mount and secure such components as the MEMS capacitor or the detecting circuit on either one or both of the faces thereof not adjacent each other. As the flexible substrate is secured to both the first face and the second face of the housing, the component mounted and secured to this flexible substrate is secured to the first face and the second face of the housing. For instance, if a component is mounted to either one of them, this mounted component and the wiring electrically connecting the two faces will be constructed as an assembly of one flexible substrate. If the MEMS capacitor and the wire are constructed as a single assembly, application to various microphones having many kinds of detecting circuits and many kinds of housings in combination is made possible. Similarly, if the detecting circuit and the wire are constructed as a single assembly, application to various microphones having many kinds of MEMS capacitors and many kinds of housings in combination is made possible. Accordingly, the cost reduction advantage due to mass production can be obtained more easily.

Meanwhile, the flexible substrate can alternatively be configured such that such components as the MEMS capacitor and the detecting circuit can be mounted and secured to both of the two non-adjacent faces thereof to which this flexible substrate is secured. Therefore, needless to say, the flexible substrate of the inventive microphone can be configured such that the MEMS capacitor is mounted in the area thereof secured to the first face and the detecting circuit is mounted in the area thereof secured to the second face. Then, if the MEMS capacitor, the detecting circuit and the wire are constructed altogether as a single assembly, application to various kinds of microphones having various kinds of housing becomes easier and the cost reduction advantage due to mass production can be obtained more easily.

Preferably, said detecting circuit of the inventive microphone is comprised of a single integrated circuit. With this, the components mounted inside the housing become substantially two, i.e. the MEMS capacitor and the integrated circuit. Hence, the productivity will be improved and application to multi-product publication becomes easier.

DETAILED DESCRIPTION OF THE PREFERRED EMBODIMENTS

Figure 1:
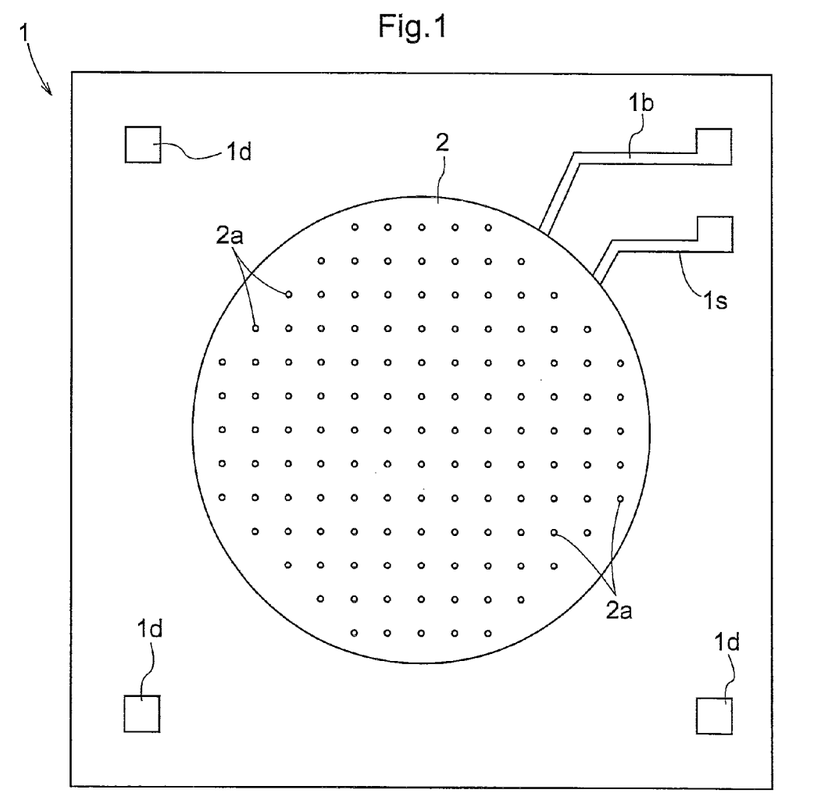
FIG. 1 is an upper view schematically showing an example of a MEMS capacitor.
Figure 2:
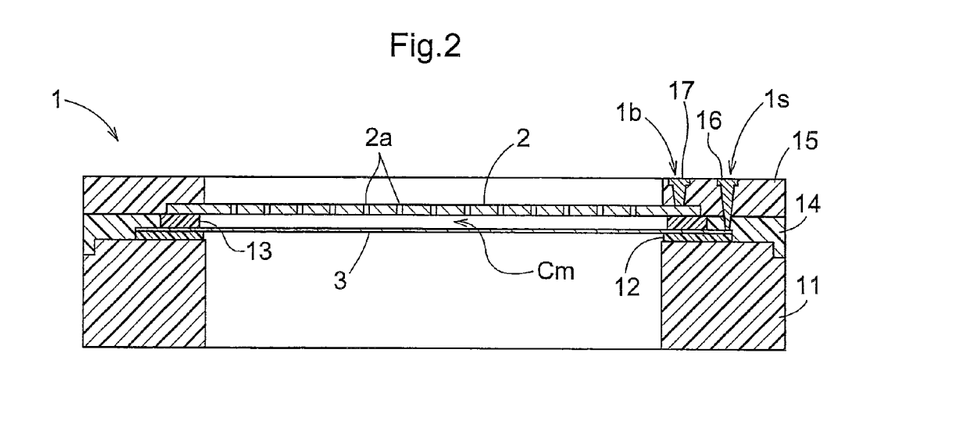
FIG. 2 is a section view schematically showing an example of a MEMS capacitor.

Next, embodiments of the present invention will be described with reference to the accompanying drawings. An MEMS capacitor 1, as is well-known, is a capacitor manufactured by the MEMS (micro electro mechanical systems) technique, with using a semiconductor processing technique from a monocrystal silicon substrate. As shown in FIG. 1 and FIG. 2, the MEMS capacitor 1 includes a back electrode plate 2 defining many holes 2a, and a diaphragm plate 3 which oscillates in response to a sound. Between the back electrode plate 2 and the diaphragm plate 3, a space is created to form a capacitor Cm. The back electrode plate 2 and the diaphragm plate 3 are formed of electrically conductive material. The back electrode plate 2 is connected to an electrode 17 which forms a terminal 1b on the outer surface of the MEMS capacitor 1. Further, the diaphragm plate 3 is connected to an electrode 16 which forms a terminal is on the outer surface of the MEMS capacitor 1. Between a silicon substrate 11 and the diaphragm plate 3, when necessary, an insulator layer 12 is formed. Layers 14, 15 too are formed of insulating material. The construction of the MEMS capacitor 1 shown in FIGS. 1 and 2 is just an example. For instance, the arrangements of the back electrode plate 2 and the diaphragm plate 3 can be reversed.

Incidentally, terminals id shown in FIG. 1 are dummy terminals provided to assist uniform fixation of the MEMS capacitor 1 when this capacitor 1 is to be surface-mounted by the reflow technique etc. These terminals are omitted form the illustration in FIG. 2. Further, in addition to the terminals 1s and 1b, if necessary, any other supplementary terminal or a guard terminal for restricting adverse influence of stray capacitance, external noise, etc. may be provided. In the instant embodiment, these are omitted, however.

Figure 3:
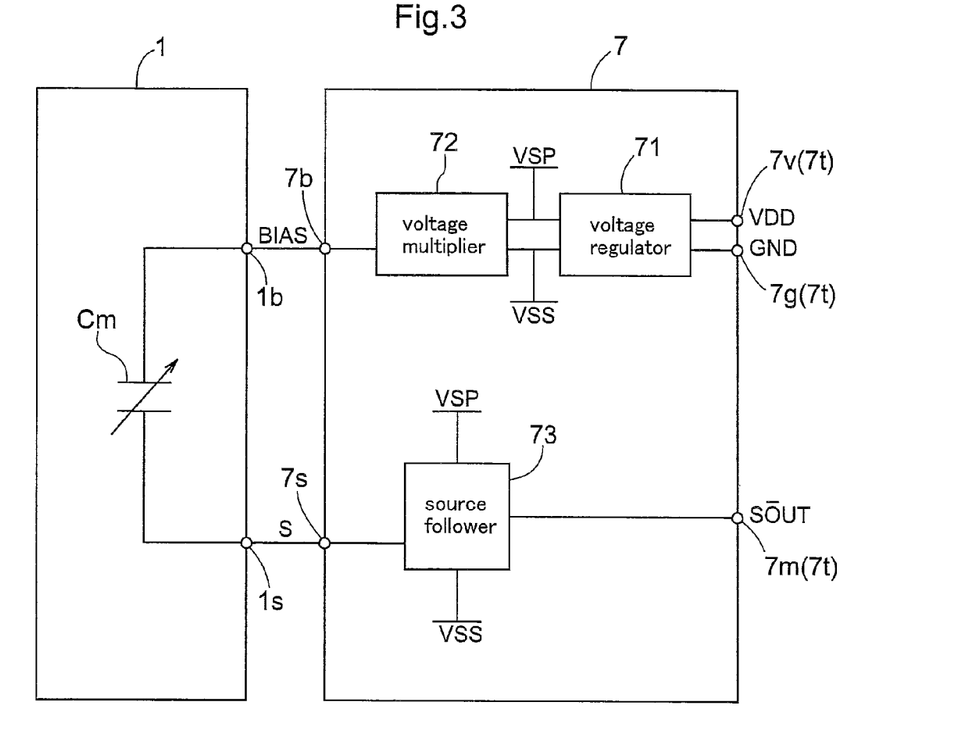
FIG. 3 is a block diagram schematically showing an example of a circuit construction of a microphone.

The diaphragm plate 3 of the MEMS capacitor 1 oscillates in response to a sound, in the course of which the distance between this diaphragm plate 3 and the back electrode plate 2 varies correspondingly. In response to this variance of the distance between the diaphragm plate 3 and the back electrode plate 2, the electrostatic capacitance of the capacitor Cm varies in correspondence therewith. Then, by detecting this change in the electrostatic capacitance, the sound is detected. The terminal 1b connected to the back electrode plate 2 is a bias input terminal, across which a bias voltage is applied. The terminal 1s connected to the diaphragm plate 3 is a detection signal output terminal, which outputs the change in the electrostatic capacitance of the capacitor Cm as a detection signal. As shown in FIG. 3, the bias input terminal 1b is connected to a voltage supply terminal (bias output terminal) 7b of the detecting circuit 7. The detection signal output terminal 1s is connected to a detection signal input terminal 7s of the detecting circuit 7.

The detecting circuit 7, in the instant embodiment, is configured as a single integrated circuit such as an ASIC (application specific integrated circuit) or an ASSP (application specific standard processor). Needless to say, the detecting circuit 7 can alternatively be configured by combining various individual active and passive components. The detecting circuit 7 is composed of a voltage regulator 71, a voltage multiplier 72 and a source follower 73. The voltage regulator 71 is a circuit for generating a reference voltage VSP-VSS for the internal circuit from a source voltage VDD (e.g. a voltage of 2 to 5 V) of the microphone 10 supplied from the outside of the detecting circuit 7. In this, the voltage VSP is the positive side voltage and VSS is the negative side voltage. VSS and the ground GND of the power source of the microphone 10 can be a same voltage. The voltage regulator 71 includes a band-gap reference circuit. Preferably, this is provided as a high precision regulator having resistance against temperature change. The voltage multiplier 72 is a circuit configured to generate a stable bias voltage BIAS based on the reference voltage VSP-VSS.

The source follower 73 is a circuit configured to effect impedance conversion on the detection signal S indicative of the change of electrostatic capacitance of the capacitor Cm. Further, this follower 73 can include a further function of amplifying the detection signal S. The detection signal S is a very high impedance signal that suffers significant signal decay and very low noise resistance. Therefore, it is not preferred that this signal be directly used as the output of the microphone 10. Because the source follower 73 has a very high input impedance, it receives the detection signal S without much decaying thereof and outputs this detection signal S as a microphone signal SOUT. Incidentally, this detecting circuit 7 can additionally include a digital converter circuit for converting the impedance-converted detection signal S into a digital signal. For instance, the source follower 73 may include the impedance converting function, the amplifying function, and the digital converting function.

The integrated circuit constituting the detecting circuit 7 includes, as terminals 7t, the bias output terminal 7b for outputting at least the bias voltage BIAS, the detection signal input terminal 7s for receiving the detection signal S, the power source terminal 7v for receiving the power source voltage and the ground terminal 7g, and the microphone signal output terminal 7m for outputting the microphone signal SOUT which is the detection signal after the impedance conversion. These terminals 7t are connected respectively to a microphone terminal 10t to be described later. Hence, the microphone 10 and the circuit of an electronic instrument such as a mobile phone or an IC recorder in which this microphone 10 is mounted, are connected to each other via the microphone terminal 10t.

Figure 4:
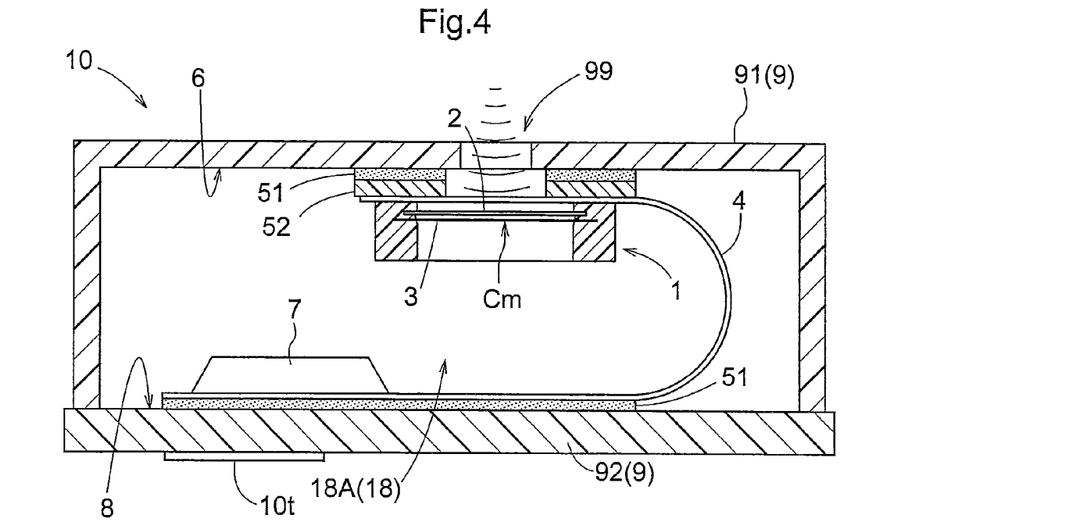
FIG. 4 is a section view schematically showing an example of microphone construction.

The MEMS capacitor 1 and the detecting circuit 7 are electrically connected to each other via a wire formed on a flexible substrate 4. In the instant embodiment, the MEMS capacitor 1 and the detecting circuit 7 are mounted on the single flexible substrate 4 as illustrated in FIG. 4. That is, the MEMS capacitor 1, the detecting circuit 7, and the wire connecting these together constitute a single assembly. Here, the flexible substrate refers to a printed wiring assembly which is generally thin and flexible. As the insulating material, generally, polyimide or crystalline polymer having high flexibility will be employed. Taking such other factors as the moisture absorbency, dimension stability, stability of material supply, etc., glass epoxy resin, aramid film or the like may be employed as the insulating material. As illustrated in FIG. 4, the flexible substrate 4 is disposed under a bent state inside the housing 9.

The housing 9 has a tubular shape such as a cylindrical shape, an oval cylindrical shape, a square prism shape, a polygonal prism shape, etc. The base portion 92 thereof is a rigid substrate. This rigid substrate 92 includes, at its portions corresponding to the terminal ends of the flexible substrate 4, wiring pattern to be electrically connected with at least the power source terminal 7v, the ground terminal 7g, the microphone signal output terminal 7m of the detecting circuit 7. The rigid substrate 92 is a multi-layered substrate having wiring patterns at least on its both sides. The power source and signal wires connected with the flexible substrate 4 on the side of the inner face 8 ("the second face 8" to be described later) of the housing 9 are guided to the outer face of the housing 9 through a through hole. On the outer face of the rigid substrate (base portion) 92, the microphone terminal 10t is formed. Incidentally, the microphone terminal 10, which constitutes power source and signal terminals, is, in actuality, provided in plurality in the microphone 10. In the schematic diagram shown in FIG. 4, etc., however, only one of them is shown as representative for the sake of simplicity of illustration.

On the rigid substrate (base portion) 92, there is mounted a bottomed cylindrical cover 91 having one side thereof opened. In the bottom of the cover 92, there is provided an aperture which forms an acoustic hole 99. Then, the MEMS capacitor 1 is disposed on the side of the inner face 6 ("the first face" to be described later) of the housing 9 in such a manner than the back electrode plate 2 of the MEMS capacitor 1 is placed in opposition to this acoustic hole 99. As described above, the dispositions of the back electrode plate 2 and the diaphragm plate 3 can be reversed. However, the centers of the back electrode plate 2 and of the diaphragm plate 3 are located on a common axis in the oscillation direction of the diaphragm plate 3. Therefore, the MEMS capacitor 1 is secured to the inner side face 6 having the acoustic hole 99 in such a manner that the centers of the acoustic hole 99, the back electrode plate 2 and of the diaphragm plate 3 are on the same axis in the oscillation direction of the diaphragm plate 3 and also that either one of the back electrode plate 2 and the diaphragm plate 3 is placed in opposition to the acoustic hole 99.

Further, in the instant embodiment, the MEMS capacitor 1 is mounted on the flexible substrate 4 as described above. Therefore, as this flexible substrate 4 is secured to the side of the inner face 6 of the housing via adhesive agent 51 and a reinforcing plate 52, the MEMS capacitor 1 is disposed on the inner face 6 of the housing 9. Needless to say, a hole is provided also at the position of the flexible substrate 4 corresponding to the back electrode plate 2 of the MEMS capacitor 1. Hence, sound reaches the diaphragm plate 3 through the back electrode plate 2, without being interfered with by the flexible substrate 4.

Namely, of the inner faces of the housing 9 having the acoustic hole 99, the MEMS capacitor 1 is secured to the first face 6 having the acoustic hole 99 and is electrically connected on this first face 6. In the embodiment shown in FIG.

4, as the MEMS capacitor 1 is mounted within the area of the flexible substrate 4 secured to the first face 6, the MEMS capacitor 1 is electrically connected on the first face 6 and secured to this first face 6. Further, the detecting circuit 7 for detecting change in the electrostatic capacity of the MEMS capacitor 1 is secured and electrically connected to the second face 8 which is not adjacent the first face 6. In the embodiment shown in FIG. 4, as the detecting circuit 7 is mounted within the area of the flexible substrate 4 secured to the second face 8, the detecting circuit 7 is electrically connected and secured to the second face 8. In this case, the MEMS capacitor 1 and the detecting circuit 7 are mounted on the flexible substrate 4 by the reflow technique or the like and secured to this flexible substrate 4. And, as this flexible substrate 4 is secured to the first face 6 and the second face 8, the MEMS capacitor 1 and the detecting circuit 7 are secured to the first face 6 and the second face 8, respectively.

Further, the flexible substrate 4 is secured to the first face 6 and the second face 8 of the inner faces of the housing 9, the first face 6 and the second face 8 being not adjacent each other. And, this substrate 4 is disposed under a bent state inside the housing 9. With these, there can be established electrical connection between the first face 6 and the second face 8 via the wires formed on the flexible substrate 4. In the area of the flexible substrate 4 secured to the first face 6, the MEMS capacitor is mounted. And, in the area of the flexible substrate 4 secured to the second face 8, the detecting circuit 7 is mounted. Therefore, it is possible to form wires for connecting the MEMS capacitor 1 with the detecting circuit 7 on the same substrate. That is, by mounting the MEMS capacitor 1 and the detecting circuit 7 on the single flexible substrate 4, restriction imposed on the layout of the MEMS capacitor 1 in the housing 6 is relaxed and greater freedom in layout can be obtained. As substantially entire housing 9 can be utilized as the back chamber 18 (18A), the microphone can be constructed without needing to use a high-performance MEMS capacitor and/or a high-performance detecting circuit (amplifier circuit).

When such small microphone 10 is to be mounted in a small electronic instrument such as a mobile phone, an IC recorder, etc., it is advantageous for its sound collecting performance if the acoustic hole 99 is disposed to face the outside of such electronic instrument. On the other hand, the microphone terminal 10t to be connected to the circuit inside the electronic instrument is to be connected with an electronic circuit disposed inside the electronic instrument. Therefore, it is often advantageous to dispose this microphone terminal 10t to face the inside the electronic instrument. That is, it is advantageous if the MEMS capacitor 1 and the detecting circuit 7 are secured to faces in the housing 9 in opposition to each other. As shown in FIG. 4, according to this embodiment, the MEM capacitor 1 and the detecting circuit 7 are secured to the faces in the housing 9 opposed to each other and these components can be connected to each other via the flexible substrate 4 having good electrical characteristics.

Incidentally, when the acoustic hole 99 is disposed to face the outside of such electronic instrument, in order to prevent intrusion of dust, water, etc. through the acoustic hole 99, there is employed also the bottom acoustic hole type microphone having this acoustic hole 99 provided inside the electronic instrument. In this case, the connection of the electronic circuit inside the electronic instrument may be effected on the outer side of this electronic instrument. In this case, even with such bottom acoustic hole type microphone, the arrangement of securing the MEMS capacitor 1 and the detecting circuit 7 to the mutually opposed faces of the housing 9 will be needed. Accordingly, the arrangement of the present invention that secures the MEMS capacitor 1 and the detecting circuit 7 to the mutually opposed faces of the housing 9 and connects these to each other via the flexible substrate having good electronic characteristics is applicable not only to the top acoustic hole type embodiment shown in FIG. 4, but to the bottom acoustic hole type microphone.

Figure 5:
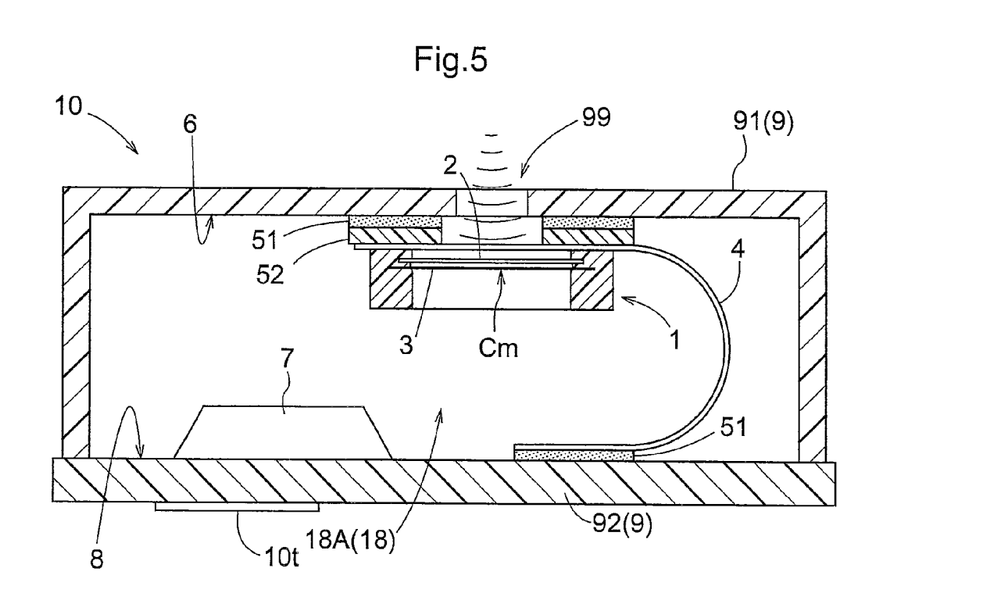
FIG. 5 is a section view schematically showing a second example of microphone construction.
Figure 6:
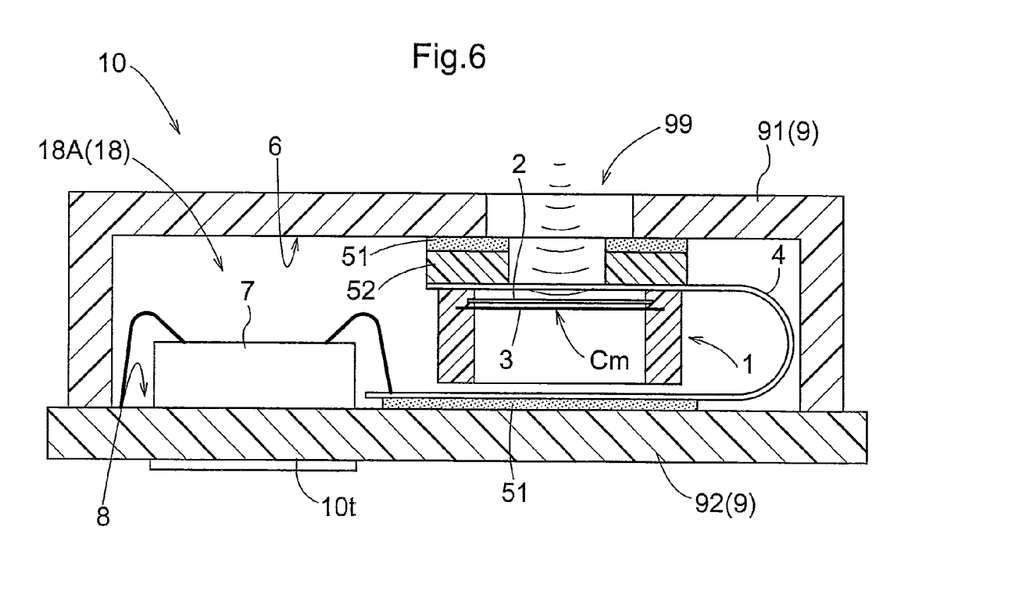
FIG. 6 is a section view schematically showing a third example of microphone construction.
Figure 7:
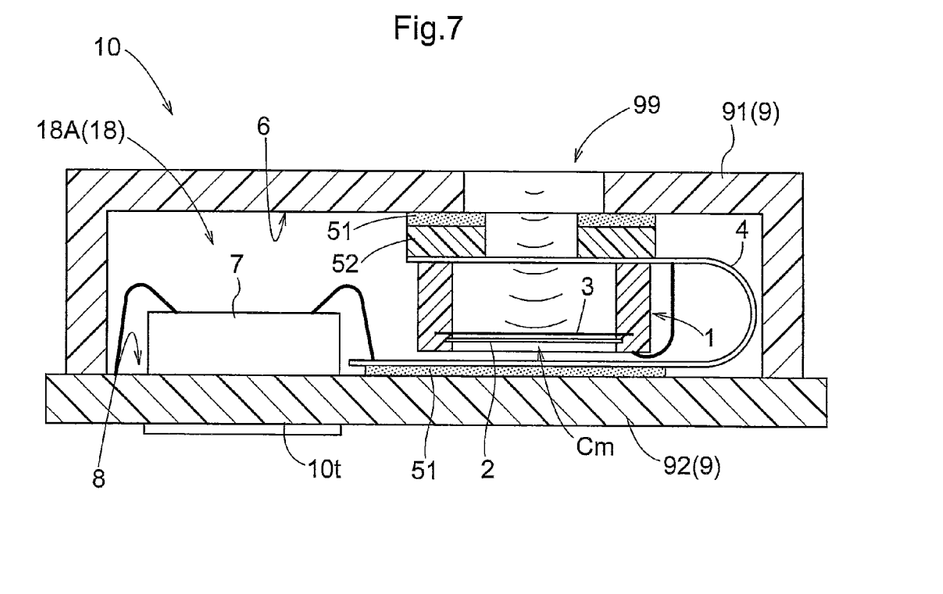
FIG. 7 is a section view schematically showing a fourth example of microphone construction.

In the embodiment shown in FIG. 4, the MEMS capacitor 1 and the detecting circuit 7 are mounted on the same single flexible substrate 4. However, a different embodiment is also possible as shown in FIG. 5, wherein the detecting circuit 7 is mounted directly on the rigid substrate 92 and the flexible substrate 4 mounting the MEMS capacitor 1 is connected to the pattern provided on the rigid substrate 92. Though not shown, needless to say, the reverse arrangement wherein the MEMS capacitor 1 is mounted directly on the rigid substrate and the flexible substrate 4 mounting the detecting circuit 7 is connected to the pattern provided on the rigid substrate 92 is also possible. Further, as illustrated in FIG. 6, the flexible substrate 4 may be secured to the rigid substrate 92 and these flexible substrate 4 and the rigid substrate 92 and the detecting circuit 7 can be connected to each other by mans of e.g. wire bonding using metal wire. In particular, this arrangement will be useful and effective in case the detecting circuit 7 is not a packaged flip chip, but mounted under a bare condition. Still further, as shown in FIG. 7, the MEMS capacitor 1 too can be connected via wire bonding to the flexible substrate 4. In this case, as also shown in FIG. 7, the direction of securing the MEMS capacitor 1 may be made different from that in the examples shown in FIGS. 4-6, so that the terminals 1s, 1b are located on the opposite side away from the first face 6.

Figure 8:
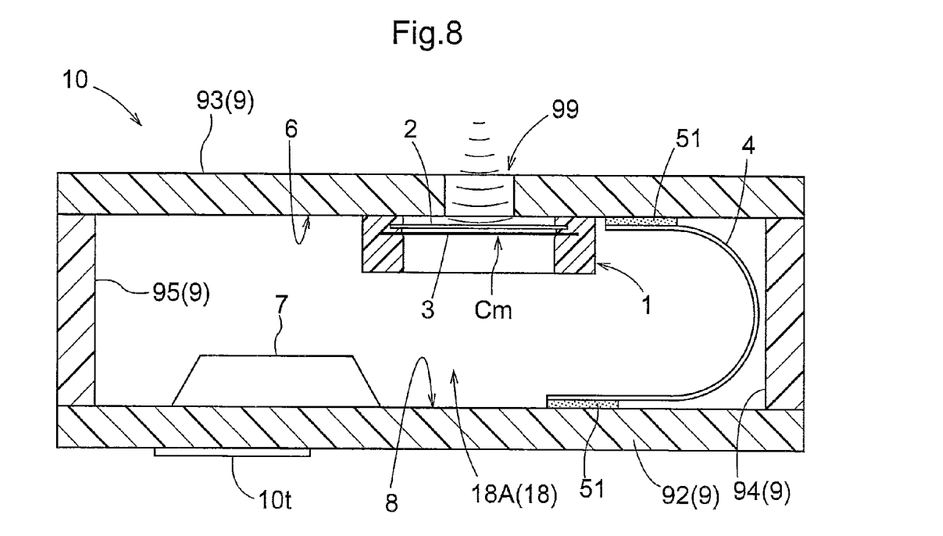
FIG. 8 is a section view schematically showing a fifth example of microphone construction.

FIG. 8 shows a still further embodiment. In this, the housing 9 is comprised of a plurality of rigid substrates including its portions corresponding to a case 91. Namely, the housing 9 includes an acoustic hole side substrate (first rigid substrate) 93, a base side substrate (second rigid substrate) 92, and side face members 94, 95. Needless to say, the side face members 94, 95 too can be formed as rigid substrates. The acoustic hole side substrate 93 corresponds to the bottom portion of the case 91 in the embodiment shown in FIGS. 4 and 5 and includes an acoustic hole 99. Of the inner faces of the housing 9, the first face 6 is the component mounting face of the acoustic hole side substrate 93 and on this component mounting face, the MEMS capacitor 1 is mounted. The base side substrate 92 corresponds to the base portion like the embodiment shown in FIGS. 4 and 5. The second face 8 of the inner faces of the housing 9 is the component mounting face of the base side substrate 92 and on this component mounting face, the detecting circuit 7 is mounted and on the back face thereof, the microphone terminal 10t is provided.

The acoustic hole side substrate (first rigid substrate) 93 and the base side substrate (second rigid substrate) 92 include patterns for connecting the flexible substrate 4. The component mounting face (first face 6) of the acoustic hole side substrate 93 mounting the MEMS capacitor 1 and the component mounting face (second face 8) of the base side substrate 92 mounting the detecting circuit 7 are mutually opposed faces not adjacent each other. The flexible substrate 4 is secured to the first face 6 and the second face 8 and is disposed under a bent state thereof inside the housing 9. Further, the flexible substrate 4 includes wires for electrically connecting the first face 6 and the second face 8, thus electrically connecting the MEMS capacitor 1 and the detecting circuit 7 to each other.

Meanwhile, like the microphone having the constructions described above with reference to FIG. 4 and FIG. 5 the microphone having the construction illustrated in FIG. 8 too is not limited to the top acoustic hole type, but can be the bottom acoustic hole type microphone. Detailed description thereof is omitted here since it is assumed that those skilled in the art would easily arrive at and implement such construction. Further, in the section views schematically shown in FIGS. 4 through 8, the adhesive agent 51 is employed in securing the flexible substrate 4 to the first face 6 and the second face 8. However, other methods such as a double-side bonding tape, fusing, soldering etc. may be employed, instead.

Next, some additional explanation will be given on the characterizing features of the present invention. FIGS. 9 and 10 show conventional microphones 10B construction examples as reference for comparison. FIG. 9 shows an example of the conventional top acoustic hole type microphone. FIG. 10 shows an example of the conventional bottom acoustic hole type microphone. With these conventional microphones 10B, the MEMS capacitor 1 and the detecting circuit 7 are both secured to the substrate 92 which is a same single substrate. Therefore, the back chamber 18B depends on the size of the trench formed in the MEMS capacitor 1, hence, this back chamber 18B is much smaller than the back chamber 18A shown in FIG. 4. In this case, in order to enlarge the back chamber 18B, enlargement of the trench is needed, which results in increase in the thickness of the silicon substrate 11 of the MEMS capacitor 1, thus inviting disadvantageous cost increase. Moreover, in order to cope with various specifications of microphone, a great variety of MEMS capacitors need to be prepared. Hence, the mass production cost reduction effect will be low and the production cost will increase. On the other hand, according to the present invention, such problems can be restricted or overcome. Incidentally, in the constructions of microphone 10B illustrated in FIGS. 9 and 10, metal wires are needed for connecting the terminals 1b, 1s on the upper face of the MEMS capacitor 1 and the rigid substrate 92 by wire bonding. However, illustration of such metal wires is omitted in these figures.

Incidentally, as described in the Japanese Patent Application "Kokai" No. 2007-81614, it is possible to enlarge the back chamber by providing the acoustic hole immediate below the trench formed in the MEMS capacitor 1. However, with the construction disclosed in the Japanese Patent Application "Kokai" No. 2007-81614, the MEMS capacitor 1 and the detecting circuit 7 are mounted on the same rigid substrate. Therefore, when this construction is to be mounted in a small electronic instrument such as a mobile phone, an IC recorder or the like, it is difficult to optimize the layout of the acoustic hole and the layout of the microphone terminal.

In the above, with utilization of the microphone housing disclosed in Japanese Patent Application "Kokai" No. 2007-81614, the MEMS capacitor 1 and the detecting circuit 7 could be mounted on different rigid substrates so that these rigid substrates may be connected to each other via a conductive member such as a coil spring. However, the contact resistance between the rigid substrate and the conductive member is much greater than that of e.g. soldering. And, the detection signal S of detecting change in the electrostatic capacitance of the MEMS capacitor 1 is a weak signal having a very high impedance as described hereinbefore. Therefore, if the rigid substrates are connected to each other via a conductive member such as a coil spring for connecting the MEMS capacitor 1 and the detecting circuit 7, there will occur significant signal decay in the detection signal S, and vulnerability of external noise too will increase. In the microphone construction disclosed in Japanese Patent Application "Kokai" No. 2007-81614, the MEMS capacitor 1 and the detecting circuit 7 are both mounted on rigid substrates and electric communication between the detecting circuit 7 and the microphone terminal 10t is provided via the conductive member connecting these rigid substrates to each other. That is, the construction is configured merely such that the detection signal (microphone signal) after impedance conversion is transmitted across the plurality of rigid substrates. On the other hand, according to the present invention, the MEMS capacitor 1 and the detecting circuit 7 are connected to each other via the flexible substrate 4 without causing such contact resistance. Hence, the signal decay in the detection signal S is small even before impedance conversion thereof and the construction is less vulnerable to external noises as well.

As described exemplarily above by way of some currently preferred embodiments thereof, with use of the present invention, the MEMS capacitor can be laid out with high degree of freedom, without inviting deterioration in the electrical characteristics such as signal decay, reduction in noise resistance, etc. And, it is possible to employ a same MEMS capacitor in various microphones having a variety of housings.

The microphone according to the present invention may be applied to a small microphone to be mounted in a small electronic instrument such as a mobile phone, an IC recorder, etc.

| FIG. 1 | |
|---|---|
| 1b | Bias input terminal |
| 1s | Detection signal output terminal |
| 2 | Back electrode plate |
| 2a | Holes |

| FIG. 2 | |
|---|---|
| 1 | MEMS capacitor |
| 1b | Bias input terminal |
| 1s | Detection signal output terminal |
| 2 | Back electrode plate |
| 2a | Holes |
| 3 | Diaphragm plate |
| 11 | Silicon substrate |
| 12 | Insulator layer |
| 14 | Layer |
| 15 | Layer |
| 16 | Electrode |
| 17 | Electrode |
| Cm | Capacitor |

| FIG. 3 | |
|---|---|
| 1 | MEMS capacitor |
| 1b | Bias input terminal |
| 1s | Detection signal output terminal |
| 7 | Detecting circuit |
| 7b | Bias output terminal |
| 7g | Ground terminal |
| 7m | Microphone signal output terminal |
| 7s | Detection signal input terminal |
| 7t | Terminals |
| 7v | Power source terminal |
| 71 | Voltage multiplier |
| 72 | Voltage regulator |
| 73 | Source follower |
| Cm | Capacitor |

| FIG. 4 | |
|---|---|
| 1 | MEMS capacitor |
| 2 | Back electrode plate |
| 3 | Diaphragm plate |
| 4 | Flexible substrate |
| 6 | Inner or first face |
| 7 | Detecting circuit |
| 8 | Inner or second face |
| 9 | Housing |
| 10 | Microphone |
| 10t | Microphone terminal |
| 18 | Back chamber |
| 18A | Back chamber |
| 51 | Adhesive agent |
| 52 | Reinforcing plate |
| 91 | Cylindrical cover |
| 92 | Base portion |
| 99 | Acoustic hole |
| Cm | Capacitor |

| FIG. 5 | |
|---|---|
| 1 | MEMS capacitor |
| 2 | Back electrode plate |
| 3 | Diaphragm plate |
| 4 | Flexible substrate |
| 6 | Inner or first face |
| 7 | Detecting circuit |
| 8 | Inner or second face |
| 9 | Housing |
| 10 | Microphone |
| 10t | Microphone terminal |
| 18 | Back chamber |
| 18A | Back chamber |
| 51 | Adhesive agent |
| 52 | Reinforcing plate |
| 91 | Cylindrical cover |
| 92 | Base portion or rigid substrate |
| 99 | Acoustic hole |
| Cm | Capacitor |

| FIG. 6 | |
|---|---|
| 1 | MEMS capacitor |
| 2 | Back electrode plate |
| 3 | Diaphragm plate |
| 4 | Flexible substrate |
| 6 | Inner or first face |
| 7 | Detecting circuit |
| 8 | Inner or second face |
| 9 | Housing |
| 10 | Microphone |
| 10t | Microphone terminal |
| 18 | Back chamber |
| 18A | Back chamber |
| 51 | Adhesive agent |
| 52 | Reinforcing plate |
| 91 | Cylindrical cover |
| 92 | Base portion or rigid substrate |
| 99 | Acoustic hole |
| Cm | Capacitor |

| FIG. 7 | |
|---|---|
| 1 | MEMS capacitor |
| 2 | Back electrode plate |

-continued

| FIG. 7 | |
|---|---|
| 3 | Diaphragm plate |
| 4 | Flexible substrate |
| 6 | Inner or first face |
| 7 | Detecting circuit |
| 8 | Inner or second face |
| 9 | Housing |
| 10 | Microphone |
| 10t | Microphone terminal |
| 18 | Back chamber |
| 18A | Back chamber |
| 51 | Adhesive agent |
| 52 | Reinforcing plate |
| 91 | Cylindrical cover |
| 92 | Base portion or rigid substrate |
| 99 | Acoustic hole |
| Cm | Capacitor |

| FIG. 8 | |
|---|---|
| 1 | MEMS capacitor |
| 2 | Back electrode plate |
| 3 | Diaphragm plate |
| 4 | Flexible substrate |
| 6 | Inner or first face |
| 7 | Detecting circuit |
| 8 | Inner or second face |
| 9 | Housing |
| 10 | Microphone |
| 10t | Microphone terminal |
| 18 | Back chamber |
| 18A | Back chamber |
| 51 | Adhesive agent |
| 92 | Base portion or rigid substrate |
| 93 | Acoustic hole side substrate |
| 94 | Side face member |
| 95 | Side face member |
| 99 | Acoustic hole |
| Cm | Capacitor |

| FIG. 8 | |
|---|---|
| 1 | MEMS capacitor |
| 2 | Back electrode plate |
| 3 | Diaphragm plate |
| 6 | Inner or first face |
| 7 | Detecting circuit |
| 8 | Inner or second face |
| 9 | Housing |
| 10B | Microphone |
| 10t | Microphone terminal |
| 18 | Back chamber |
| 18B | Back chamber |
| 92 | Base portion or rigid substrate |
| 99 | Acoustic hole |
| Cm | Capacitor |

| FIG. 6 | |
|---|---|
| 1 | MEMS capacitor |
| 2 | Back electrode plate |
| 3 | Diaphragm plate |
| 6 | Inner or first face |
| 7 | Detecting circuit |
| 8 | Inner or second face |
| 9 | Housing |

| FIG. 6 | |
|---|---|
| 10B | Microphone |
| 10t | Microphone terminal |
| 18 | Back chamber |
| 18B | Back chamber |
| 92 | Base portion or rigid substrate |
| 99 | Acoustic hole |
| Cm | Capacitor |

The invention claimed is:

1. A microphone having a housing defining an acoustic hole and having inner faces, comprising:
   a MEMS capacitor secured to and electrically connected with a first face of said inner faces of the housing, said first face defining said acoustic hole;
   a detecting circuit secured to and electrically connected with a second face of said inner faces of the housing, said second face being not adjacent said first face, said detecting circuit detecting at least a change in the electrostatic capacity of said MEMS capacitor; and
   a flexible substrate secured to said first face and said second face and disposed under a bent state inside said housing, said flexible substrate establishing electrical connection between said MEMS capacitor and said detecting circuit via a wire electrically connecting said first face and said second face,
   wherein said flexible substrate is configured such that the MEMS capacitor is mounted in the area of the flexible substrate secured to said first face, and
   wherein said flexible substrate is configured such that the detecting circuit is mounted in the area of the flexible substrate secured to said second face.

2. The microphone according to claim 1, wherein said detecting circuit is comprised of a single integrated circuit.

* * * * *